US008659687B2

(12) United States Patent
Takata

(10) Patent No.: US 8,659,687 B2
(45) Date of Patent: Feb. 25, 2014

(54) PHOTOELECTRIC CONVERSION FILM STACK-TYPE SOLID-STATE IMAGING DEVICE AND IMAGING APPARATUS

(75) Inventor: Takuya Takata, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 149 days.

(21) Appl. No.: 13/049,850

(22) Filed: Mar. 16, 2011

(65) Prior Publication Data

US 2011/0228148 A1   Sep. 22, 2011

(30) Foreign Application Priority Data

Mar. 17, 2010   (JP) ................................. 2010-061624

(51) Int. Cl.
*H04N 5/335* (2011.01)

(52) U.S. Cl.
USPC .......................................... 348/273; 348/294

(58) Field of Classification Search
USPC .................................................. 348/273, 294
See application file for complete search history.

(56) References Cited

U.S. PATENT DOCUMENTS

| | | | | |
|---|---|---|---|---|
| 6,649,991 | B1 * | 11/2003 | Chen et al. ..................... | 257/433 |
| 7,816,705 | B2 * | 10/2010 | Lee et al. ......................... | 257/99 |
| 7,859,072 | B2 | 12/2010 | Han | |
| 8,486,748 | B2 | 7/2013 | Ikeda et al. | |
| 8,541,730 | B2 | 9/2013 | Inuiya | |
| 2005/0205903 | A1 * | 9/2005 | Hioki ............................ | 257/291 |
| 2006/0181629 | A1 | 8/2006 | Miyashita et al. | |
| 2007/0045760 | A1 * | 3/2007 | Ihama ............................ | 257/431 |
| 2007/0108579 | A1 * | 5/2007 | Bolken et al. ................. | 257/680 |
| 2008/0042228 | A1 | 2/2008 | Han | |
| 2008/0251872 | A1 * | 10/2008 | Kwon et al. ................... | 257/432 |
| 2009/0091806 | A1 | 4/2009 | Inuiya | |
| 2011/0143488 | A1 | 6/2011 | Ikeda et al. | |
| 2011/0261223 | A1 | 10/2011 | Akiyama | |

FOREIGN PATENT DOCUMENTS

| | | |
|---|---|---|
| JP | S63-164268 A | 7/1988 |
| JP | H02-166769 A | 6/1990 |
| JP | 06-310699 | 11/1994 |
| JP | 2006-094263 A | 4/2006 |
| JP | 2006-156801 A | 6/2006 |
| JP | 2006-228938 A | 8/2006 |
| JP | 2007-184311 A | 7/2007 |

(Continued)

OTHER PUBLICATIONS

AN Office Action, "Notice of Reasons for Rejection," issued by the Japanese Patent Office on Oct. 1, 2013, which corresponds to Japanese Patent Application No. 2010-061624 and is related to U.S. Appl. No. 13/049,850.

*Primary Examiner* — Usman Khan
(74) *Attorney, Agent, or Firm* — Studebaker & Brackett PC

(57) ABSTRACT

A photoelectric conversion film stack-type solid-state imaging device includes a semiconductor substrate, a photoelectric conversion layer, a photoelectric conversion layer, and a conductive light shield film. A signal reading portion is formed on the semiconductor substrate. The photoelectric conversion layer is stacked above the semiconductor substrate and includes a photoelectric conversion film formed between a first electrode film and a second electrode films which is divided into a plurality of regions corresponding to pixels respectively. The first light transmission layer is stacked above the light incidence side of the photoelectric conversion layer and made of a material that transmits light at least partially. The conductive light shield film is formed in the same layer level as the first light transmission layer and covers an outside of an effective pixel region.

5 Claims, 14 Drawing Sheets

(56) References Cited

FOREIGN PATENT DOCUMENTS

| JP | 2008-053713 A | 3/2008 |
|---|---|---|
| JP | 2008-306154 A | 12/2008 |
| JP | 2008-306160 A | 12/2008 |
| JP | 2009-094273 A | 4/2009 |
| JP | 2009-146957 A | 7/2009 |
| JP | 2009-176777 A | 8/2009 |
| JP | 2009-176949 A | 8/2009 |
| JP | 2009-244414 A | 10/2009 |

* cited by examiner

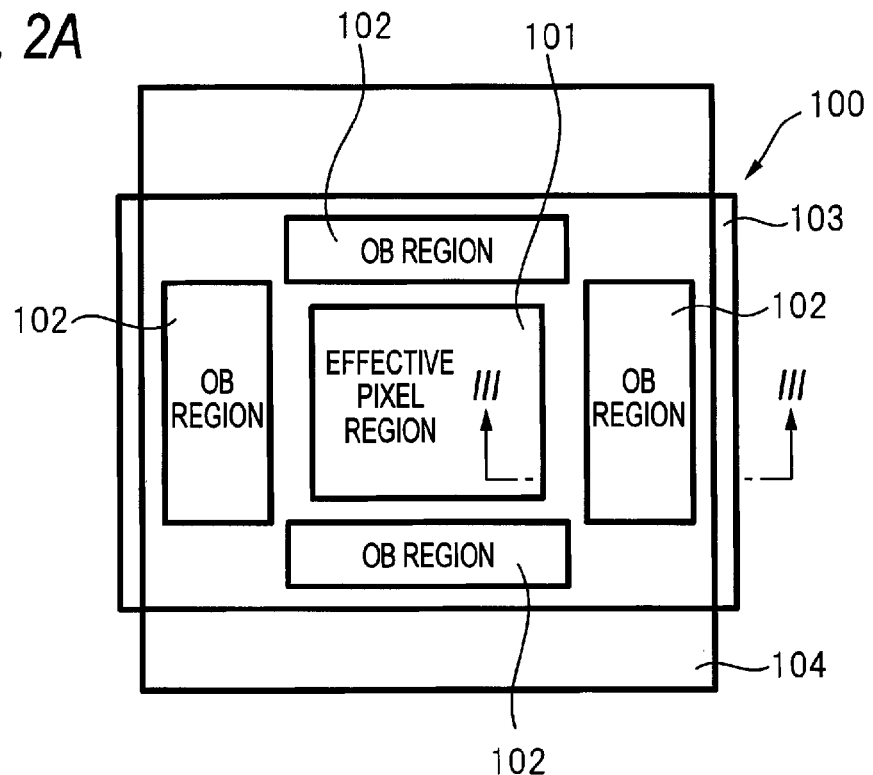
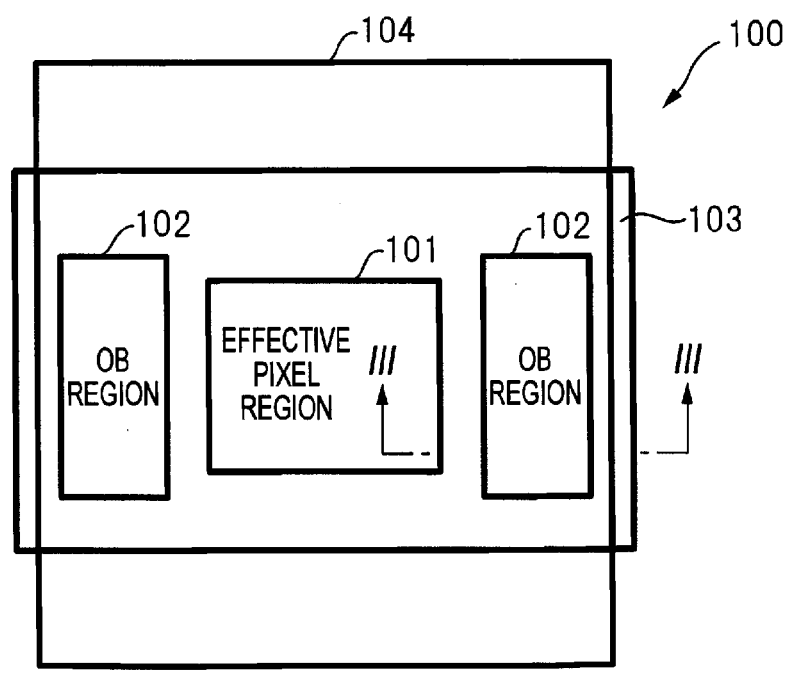

PHOTOELECTRIC CONVERSION FILM STACK-TYPE SOLID-STATE IMAGING DEVICE AND IMAGING APPARATUS

CROSS-REFERENCE TO RELATED APPLICATIONS

This application claims the benefit of Japanese Patent Application No. 2010-061624 (filed on Mar. 17, 2010), the entire contents of which are hereby incorporated by reference.

BACKGROUND

1. Technical Field

The present invention relates to a solid-state imaging device with a stacked photoelectric conversion film and an imaging apparatus including the solid-state imaging device.

2. Related Art

In conventional, commonly used CCD and CMOS image sensors (solid-state imaging devices), a photodetecting region (effective pixel region) consisting of plural pixels (photoelectric conversion portions, photodiodes) that are arranged in two-dimensional array form is formed in a semiconductor substrate surface portion and subject image signals corresponding to a subject optical image formed on the photodetecting region are output from the respective pixels. An optical black (OB) region that is covered with a light shield film is formed around the photodetecting region, and an offset component of each of subject image signals that are output from the photodetecting region is removed using, as a reference signal, a dark signal that is output from the OB region.

Subtracting a noise component (dark current; equal to an output of the OB region) that thermally occurs even without incident light from each subject image signal (each output of the photodetecting region) makes it possible to detect, with high accuracy, faint subject image signals that are output from the photodetecting region and to thereby realize a solid-state imaging device having a large S/N ratio.

In the above-described conventional CCD and CMOS solid-state imaging devices, the photoelectric conversion portions (photodiodes) and signal reading circuits (charge transfer channels and an output amplifier in the case of the CCD type and MOS transistor circuits in the case of the CMOS type) need to be formed in the same semiconductor substrate surface portion. This raises a state that the ratio of the total area of the photoelectric conversion portions to the chip area of the solid-state imaging device cannot be set to 100%. A recent trend of a decreasing aperture ratio due to miniaturization of pixels is a factor of S/N ratio reduction.

In these circumstances, attention has come to be paid to solid-state imaging devices that are configured in such a manner that photoelectric conversion portions are not formed on a semiconductor substrate and only signal reading circuits are formed on the semiconductor substrate and that a photoelectric conversion film is formed above the semiconductor substrate.

For example, in the stack-type solid-state imaging device disclosed in JP-A-6-310699, X rays or electron beams are detected through photoelectric conversion by an amorphous silicon layer, for example, stacked over a semiconductor substrate surface. In the photoelectric conversion film stack-type solid-state imaging device disclosed in JP-A-2006-228938, a color image of a subject is taken by means of three photoelectric conversion layers having a red detection photoelectric conversion film, a green detection photoelectric conversion film, and a blue detection photoelectric conversion film, respectively.

In the solid-state imaging device of JP-A-6-310699, dark current is detected by stacking a 2-μm-thick light shield layer as the topmost layer of the solid-state imaging device around an effective pixel region (photodetecting region). In the solid-state imaging device of JP-A-2006-228938, incidence of light on signal reading circuits is merely prevented by stacking a light shield film between the semiconductor substrate surface and the photoelectric conversion film (bottommost layer). No consideration is given to the structure of an OB region.

In the stack-type solid-state imaging device of JP-A-6-310699, since the 2-μm-thick light shield layer is formed in the OB region, a step of 2 μm is formed between the OB region and the photodetecting region. Diffuse reflection of light incident on the step portion may degrade a subject image. The photoelectric conversion film stack-type solid-state imaging device of JP-A-2006-228938 cannot produce subject image signals having large S/N ratios because dark current cannot be detected in a state that no light is incident on the photoelectric conversion film (i.e., the photoelectric conversion film is shielded from light).

SUMMARY OF INVENTION

According to an aspect of the invention, a photoelectric conversion film stack-type solid-state imaging device includes a semiconductor substrate, a photoelectric conversion layer, a photoelectric conversion layer, and a conductive light shield film. A signal reading portion is formed on the semiconductor substrate. The photoelectric conversion layer is stacked above the semiconductor substrate and includes a photoelectric conversion film formed between a first electrode film and a second electrode films which is divided into a plurality of regions corresponding to pixels respectively. The first light transmission layer is stacked above the light incidence side of the photoelectric conversion layer and made of a material that transmits light at least partially. The conductive light shield film is formed in the same layer level as the first light transmission layer and covers an outside of an effective pixel region.

An object of the present invention is to provide a photoelectric conversion film stack-type solid-state imaging device capable of producing high-quality image signals having large S/N ratios as well as an imaging apparatus incorporating such a photoelectric conversion film stack-type solid-state imaging device.

BRIEF DESCRIPTION OF THE DRAWINGS

FIGS. 2A and 2B are schematic views of the surfaces of solid-state imaging devices corresponding to a solid-state imaging device shown in FIG. 1, respectively.

DETAILED DESCRIPTION

Exemplary embodiments of the present invention will be hereinafter described with reference to the drawings.

Figure 1:
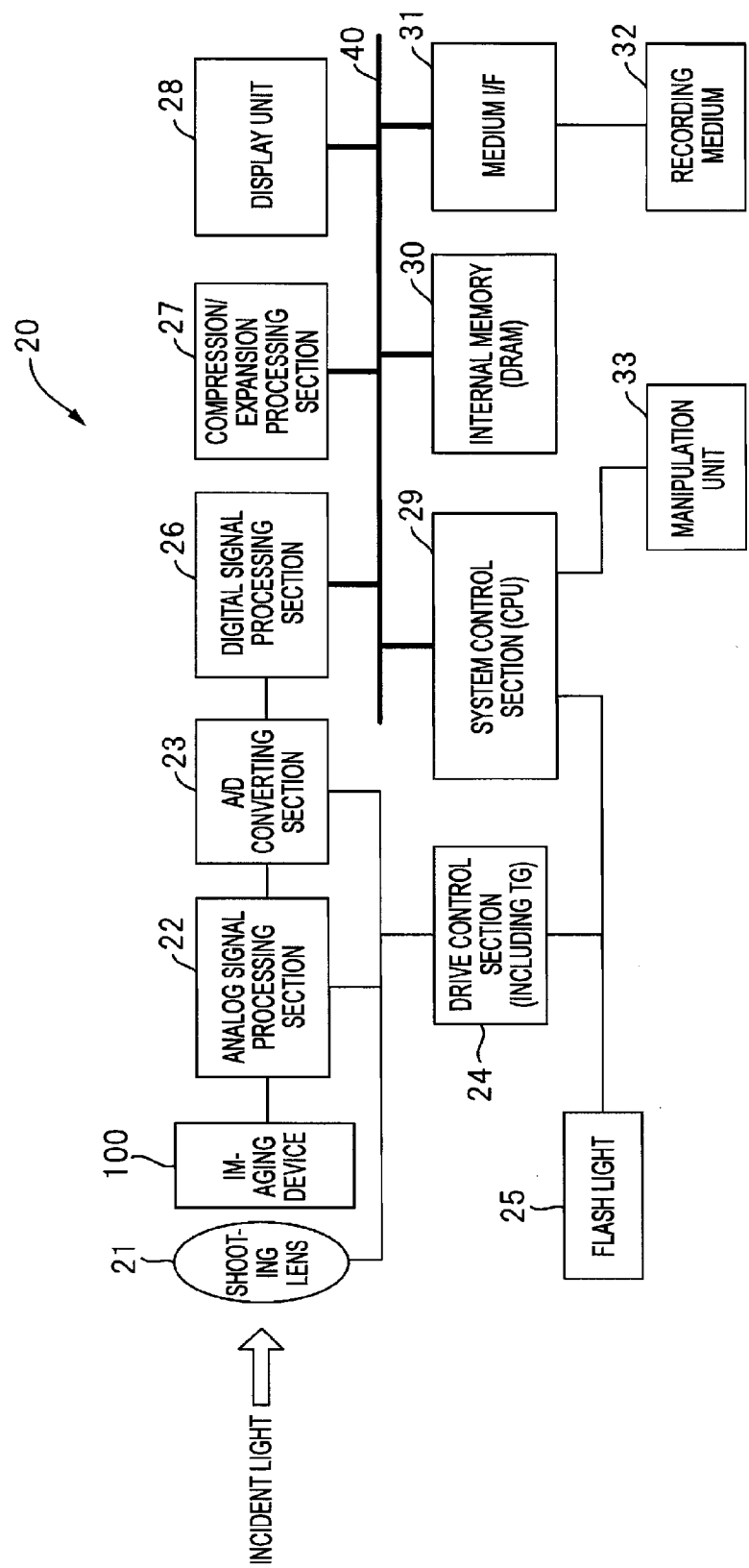
FIG. 1 is a functional block diagram of an imaging apparatus according to an exemplary embodiment of the present invention.

FIG. 1 is a block diagram showing the configuration of a digital camera (imaging apparatus) 20 according to an exemplary embodiment of the invention. The digital camera 20 is equipped with a solid-state imaging device 100, a shooting lens 21 which is disposed before the solid-state imaging device 100, an analog signal processing section 22 which performs analog processing such as automatic gain control (AGC) and correlated double sampling on analog image data that is output from the solid-state imaging device 100, an analog-to-digital (A/D) converting section 23 which converts analog image data that is output from the analog signal processing section 22 into digital image data, a drive control section (including a timing generator) 24 which drive-controls the shooting lens 21, the A/D-converting section 23, the analog signal processing section 22, and the solid-state imaging device 100 according to an instruction from a system control section (CPU; described later) 29, and a flash light 25 which emits light according to an instruction from the system control section 29. The drive control section 24 also controls of application of a prescribed bias voltage between an upper electrode film 104 and pixel electrode films 113 (both described later).

The digital camera 20 according to the exemplary embodiment is also equipped with a digital signal processing section 26 which captures digital image data that is output from the A/D-converting section 23 and performs interpolation processing, white balance correction, RGB/YC conversion processing, etc. on the digital image data, a compression/expansion processing section 27 which compresses image data into JPEG or like image data or expands JPEG or like image data, a display unit 28 which displays a menu etc. and also displays a through-the-lens image or a shot image, the system control section (CPU) 29 which supervises the entire digital camera 20, an internal memory 30 such as a frame memory, a medium interface (IF) section 31 which performs interfacing with a recording medium 32 for storing JPEG or like image data, and a bus 40 which interconnects the above blocks. A manipulation unit 33 which receives a user instruction is connected to the system control section 29.

FIG. 2A is a schematic view of the surface of the solid-state imaging device 100 shown in FIG. 1. A central rectangular region 101 of the surface of the solid-state imaging device 100 is an effective pixel region (photodetecting region), and a subject optical image that is formed on the photodetecting region 101 is converted into electrical signals which are output as subject image signals.

In the exemplary embodiment of FIG. 2A, OB (optical black) regions 102 (their structure will be described later in detail) are formed adjacent to the four sidelines of the photodetecting region 101. An organic film (photoelectric conversion film; described later) occupies a rectangular region 103. An upper electrode film (counter electrode film; described later) occupies a rectangular region 104.

FIG. 2B is a schematic view of the surface of a solid-state imaging device according to another exemplary embodiment. Whereas in the exemplary embodiment of FIG. 2A the OB regions 102 are formed adjacent to the four sidelines of the photodetecting region 101, in this exemplary embodiment OB regions 102 are formed adjacent to the two (right and left) sidelines of the photodetecting region 101.

To take a difference between a dark-time reference signal detected from OB regions 102 and a pixel signal of each of the pixels in the effective pixel region 101, OB regions 102 are formed adjacent to the ends of the effective pixel region 101 in the row direction and an OB level is acquired from the pixels in the OB regions 102 in the horizontal blanking period of each horizontal scanning period. An OB level obtained in each horizontal blanking period is clamped by a correlated double sampling (CDS) circuit of the analog signal processing section 22 shown in FIG. 1 and is used for correction of subject image signals in the effective video period that immediately follows the horizontal blanking period.

Figure 3:
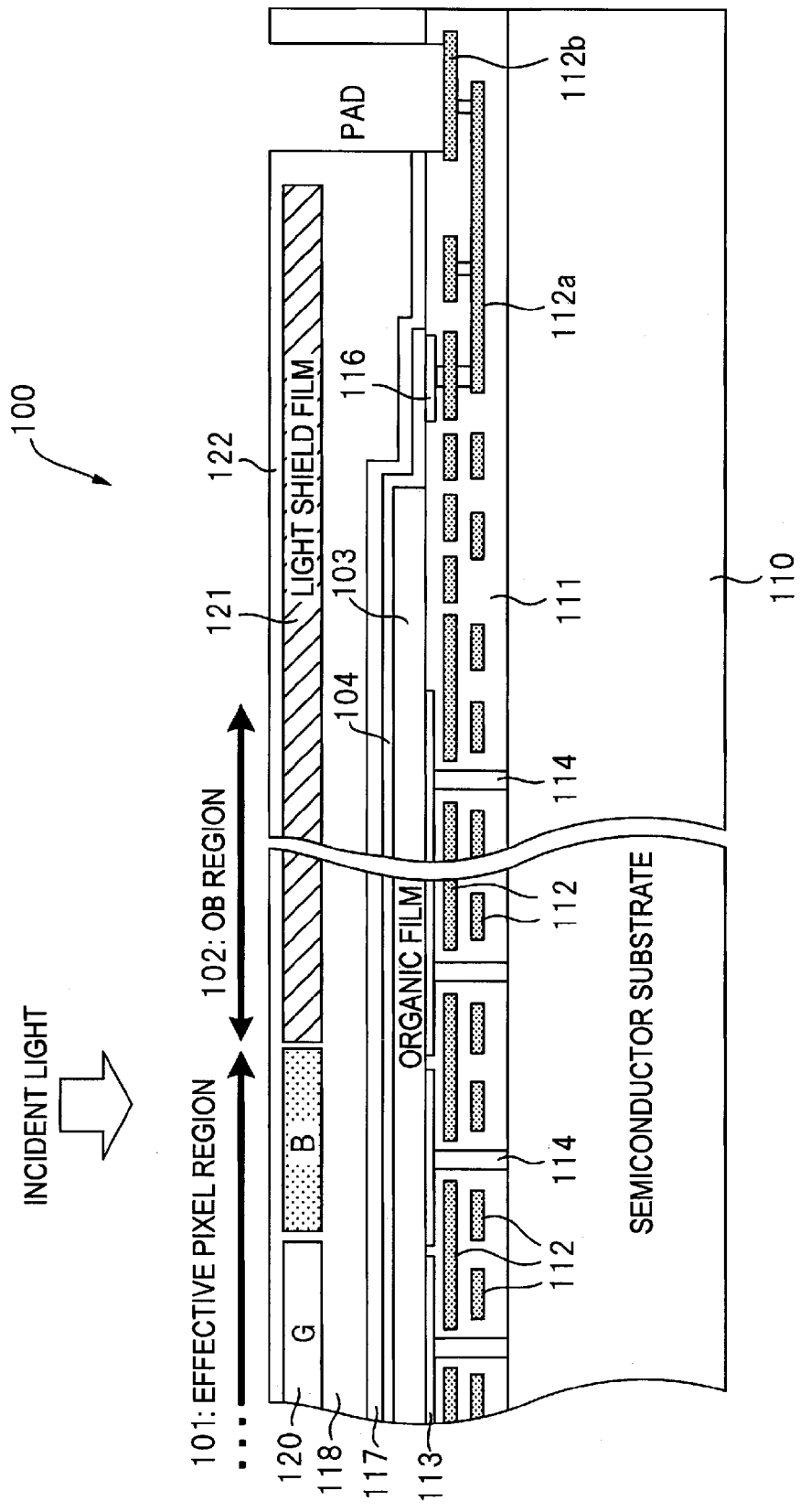
FIG. 3 is a schematic sectional view taken along line III-III in FIG. 2A or 2B.

FIG. 3 is a schematic sectional view of the solid-state imaging device 100 taken along line III-III in FIG. 2A or 2B. The photoelectric conversion film stack-type solid-state imaging device 100 is formed on a semiconductor substrate 110, and MOS circuits (not shown) are formed as signal reading circuits for the respective pixels in a surface portion of the semiconductor substrate 110. Alternatively, CCD signal reading circuits may be employed.

An insulating layer 111 is formed on the surface of the semiconductor substrate 110 and wiring layers 112 are buried in the insulating layer 111. The wiring layers 112 also function as shield plates for preventing leak incident light that is transmitted through the upper layers from entering the signal reading circuits etc.

Plural pixel electrode films 113 are formed on the surface of the insulating layer 111 so as to be separated from each other so as to correspond to the respective pixels and to be arranged in square lattice form when viewed from above. A vertical interconnection 114 extends from each pixel electrode film 113 to the surface of the semiconductor substrate 110, and each vertical interconnection 114 is connected to a signal charge storage portion (not shown) formed as a surface portion of the semiconductor substrate 110.

The signal reading circuit for each pixel reads out, as a subject image signal, a signal corresponding to the amount of signal charge stored in the corresponding signal charge storage portion. The pixel electrode films 113 are formed in the effective pixel region 101 and the OB regions 102 shown in FIGS. 2A and 2B.

A single organic film 103 (see FIGS. 2A and 2B) having a photoelectric conversion function is formed on the pixel electrode films 113 (arranged in square lattice form) so as to be common to the pixel electrode films 113, and a single upper electrode film (counter electrode film, common electrode film) 104 is formed on the organic film 103. In the solid-state imaging device 100 according to the exemplary embodiment, the lower electrode films 113 and the upper electrode film 104 and the organic film 103 which is sandwiched between the films 113 and 104 in the vertical direction constitute a photoelectric conversion layer.

An end portion of the upper electrode film 104 is electrically connected to a connection terminal 116 which is exposed in the surface of the insulating layer 111, and a prescribed voltage is applied to the upper electrode film 104 via a wiring layer 112a and a connection pad 112b.

A protective layer 117 is laid on the upper electrode film 104 and a smoothing layer 118 is laid on the protective layer 117. Color filters 120 are laid on the smoothing layer 118 in the effective pixel region 101 (see FIGS. 2A and 2B) so as to correspond to the respective pixel electrode films 113. For example, color filters of the three primary colors red (R), green (G), and blue (B) are Bayer-arranged.

In the exemplary embodiment, light shield films 121 are laid around the effective pixel region 101 in the same layer as the color filters 120. The light shield films 121 function to prevent light coming from above from shining on those portions of the organic film 103 which are formed in the OB regions 102 so that charge stored in each signal charge storage portion in the OB regions 102 produces a correct dark-time reference signal.

A planarization layer 122 is stacked on the color filters 120 and the light shield films 121.

To enable incidence of light on the organic film 103, the upper electrode film 104 is made of a conductive material that is transparent to incident light. The material of the upper electrode film 104 may be a transparent conducting oxide (TCO) having a high transmittance to visible light and low resistivity.

Although a metal thin film of Au (gold) or the like can be used, its resistance becomes extremely high when its thickness is reduced to attain a transmittance of 90% or more. TCO is thus preferable. Particularly preferable example TCOs are indium tin oxide (ITO), indium oxide, tin oxide, fluorine-doped tin oxide (FTO), zinc oxide, aluminum-doped zinc oxide (AZO), and titanium oxide. ITO is most preferable in terms of process executability, (low) resistivity, and transparency. Although in the exemplary embodiment the single upper electrode film 104 is formed so as to be common to all the pixel portions, divisional upper electrode films may be formed so as to correspond to the respective pixel portions.

The lower electrode films (pixel electrode films) 113, which are divisional thin films corresponding to the respective pixel portions, are made of a transparent or opaque conductive material, examples of which are metals such as Cr, In, Al, Ag, W, TiN (titanium nitride) and TCOs.

The light shield films 121 are made of an opaque metal material, examples of which are copper (Cu), aluminum (Al), titanium nitride (TiN), titanium (Ti), tungsten (W), tungsten nitride (WN), molybdenum (Mo), tantalum (Ta), platinum (Pt), alloys thereof, silicides thereof (silicides of transition metals), and resin which is colored black or other color. In the case of using a metal material, the light shield films 121 are formed by a known method, that is, a combination of sputtering, evaporation, or the like, photolithography/etching, and a metal mask.

The protective layer 117, the smoothing layer 118, and the planarization layer 122 not only serve for smoothing and planarization in a stacking process but also prevent degradations in the characteristics of the photoelectric conversion film (organic film) 103 due to a defect (crack, pinhole, or the like) formed therein due to dust etc. occurring in a manufacturing process and aging deteriorations of the photoelectric conversion film 103 caused by water, oxygen, etc.

The protective layer 117, the smoothing layer 118, and the planarization layer 122 are made of a transparent insulative material, examples of which are silicon oxide, silicon nitride, zirconium oxide, tantalum oxide, titanium oxide, hafnium oxide, magnesium oxide, alumina ($Al_2O_3$), a polyparaxylene resin, an acrylic resin, and a perfluoro transparent resin (CYTOP).

The protective layer 117, the smoothing layer 118, and the planarization layer 122 are formed by a known technique such as chemical vapor deposition (CVD) such as atomic layer deposition (ALD, ALCVD). If necessary, each of the protective layer 117, the smoothing layer 118, and the planarization layer 122 may be a multilayer film of plural insulating films deposited by chemical vapor deposition (CVD) or atomic layer deposition (ALD, ALCVD), or the like. The smoothing layer 118 and the planarization layer 122 are formed by smoothing and planarizing a deposited layer by removing projections by chemical mechanical polishing (CMP).

It is desirable that each of the protective layer 117, the smoothing layer 118, and the planarization layer 122 be as thin as possible while exercise its function. A preferable thickness range is 0.1 to 10 µm.

Next, an example manufacturing method will be described. An insulating layer 111 made of silicon oxide is formed on a semiconductor substrate 110 in which signal charge storage portions and signal reading circuits have been formed by a known process, while wiring layers 112 are buried in the insulating layer 111. Plugs (vertical interconnections 114) are formed by forming holes through the insulating layer 111 by photolithography and filling the holes with tungsten.

Then, a TiN film is formed on the insulating layer 111 by sputtering or the like and patterned into lower electrode films (pixel electrode films 113) by photolithography and etching.

Then, a photoelectric conversion film (organic film) 103 is formed on the lower electrode films 113 by depositing a photoelectric conversion material by sputtering, evaporation, or the like, and an upper electrode film 104 is formed on the photoelectric conversion film 103 by depositing ITO by sputtering, evaporation, or the like. Then, a protective layer 117 and a smoothing layer 118 are formed on the upper electrode film 104 by physical vapor deposition (e.g., sputtering), chemical vapor deposition (CVD), atomic layer deposition (ALD, ALCVD), or the like.

To prevent substances such as water and oxygen that will deteriorate the photoelectric conversion film 103 from being mixed into it during formation of the photoelectric conversion film 103 or the protective layer 117, it is preferable that the photoelectric conversion film 103 and the protective layer 117 be formed in vacuum or in an inert gas atmosphere consistently.

Then, where light shield films 121 should be made of a metal material, they are formed around the effective pixel region 101 by a known method, that is, a combination of sputtering, evaporation, or the like, photolithography/etching, and a metal mask.

Then, color filters of one color are formed on the portion, in the effective pixel region 101, of the smoothing layer 118 by forming a film of a color filter material and pattering it by photolithography and etching. A color filter layer 120 having a Bayer arrangement, for example, is formed by repeating this process using R, G, and B color filter materials.

Subsequently, a planarization layer 122 is formed on the color filter layer 120 by the same known technique as the protective layer 117 was formed. Microlenses may be formed on the color filter layer 120.

It is preferable that the layers that are stacked on the photoelectric conversion film 103 be formed at low film formation temperatures. That is, it is preferable that the layers which are stacked on the photoelectric conversion film 103 be made of materials that enable film formation at low temperatures that are suitable for the heat resistance of the photoelectric conversion film 103 or be made of materials that are low in heat resistance. It is preferable that the substrate temperature at the time of film formation be lower than or equal to 300° C. It is even preferable that it be lower than or equal to 200° C. And it is most preferable that it be lower than or equal to 150° C.

Likewise, it is preferable that the layer that is laid on the color filter layer 120 be made of a material that enables film formation at a low temperature that is suitable for the heat resistance of the photoelectric conversion film 103 or be made of a material that is low in heat resistance. It is preferable that the substrate temperature at the time of film formation be lower than or equal to 300° C. It is even preferable that it be lower than or equal to 200° C. And it is most preferable that it be lower than or equal to 150° C.

Figure 4:
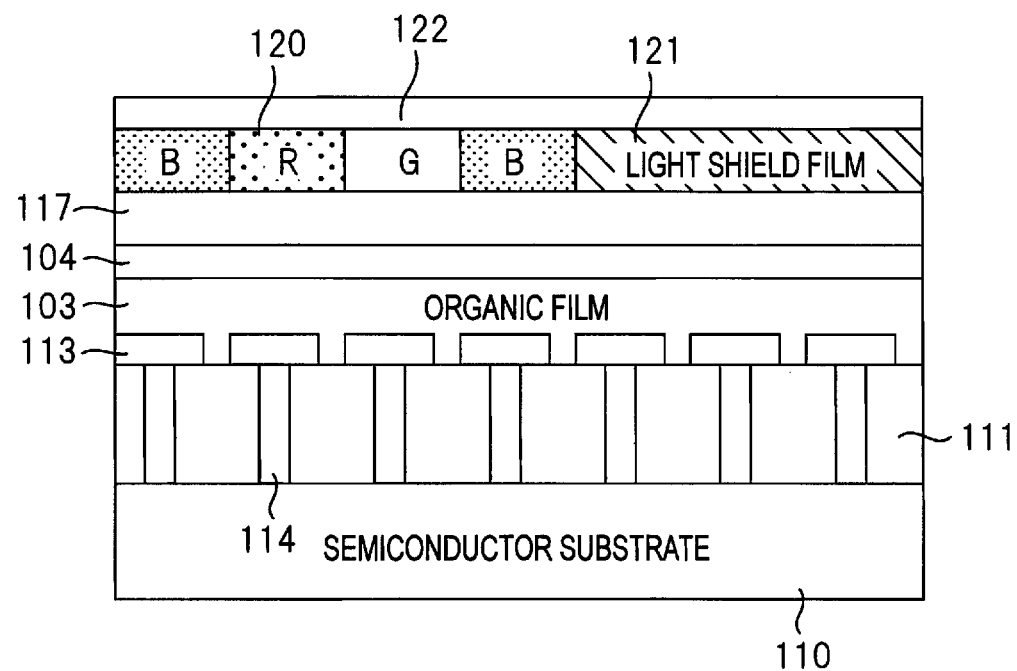
FIG. 4 is a schematic sectional view as a simplified version of FIG. 3.

FIG. 4 is a schematic sectional view as a simplified version of FIG. 3. As shown in FIG. 4, in the solid-state imaging device 100 according to the exemplary embodiment, the light shield films 121 are formed over the upper electrode film 104 in the same layer as the color filter layer 120 with the protective layer 117 (which includes the smoothing layer 118 in FIG. 4) interposed in between. Therefore, the thickness of the solid-state imaging device 100 can be reduced, the entire surface of the solid-state imaging device 100 can be made flat, and color contamination between the effective pixels for image output can be prevented. Furthermore, oblique incidence of light on the OB regions 102 can be prevented and hence the accuracy of a dark-time reference signal can be increased.

FIGS. 5-14 are schematic sectional views of solid-state imaging devices according to other exemplary embodiments of the invention. It may be necessary to change the structure involving each light shield film 121 (i.e., the structure of FIG. 4 cannot be employed) depending on the stacking conditions such as temperatures, pressures, chemical reactions, etc. that are employed in stacking the photoelectric conversion film 103, the electrode films 104 and 113, the insulating layers, the color filter layer 120, etc.

Figure 5:
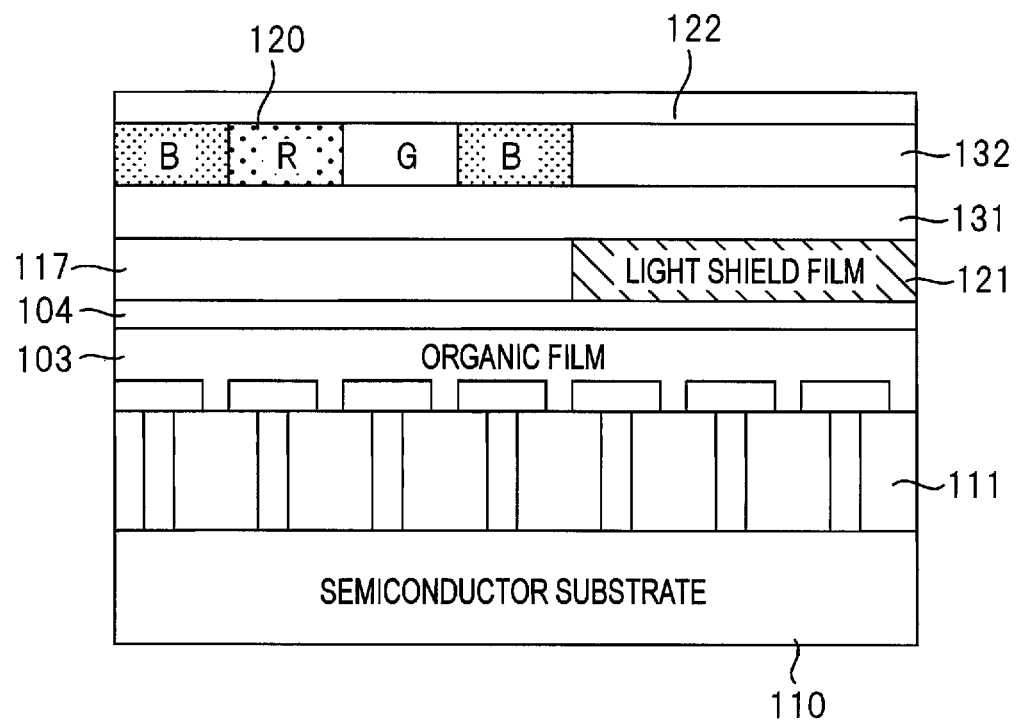
FIG. 5 is a schematic sectional view of a solid-state imaging device according to another exemplary embodiment of the invention.

In the exemplary embodiment of FIG. 5, a light shield film 121 is formed on the upper electrode film 104, a layer 131 which is a protective layer, a smoothing layer, or a smoothing layer and a protective layer is formed above the light shield film 121, and the color filter layer 120 is formed on the smoothed layer 131. Since the light shield film 121 is formed outside the effective pixel region, a protective film or the smoothing layer 117 is formed only in the effective pixel region and the light shield film 121 is formed in the same layer as the protective film or the smoothing layer 117. The color filter layer 120 is formed in the effective pixel region, and an insulating layer 132 is formed in the same layer as the color filter layer 120 so as to occupy the other region.

In this exemplary embodiment, although the distance between the photoelectric conversion film 103 and the color filter layer 120 is longer than that of the exemplary embodiment of FIG. 4 by the thickness of the one layer, it causes no problems because the layers 117 and 131 can be thin.

Figure 6:
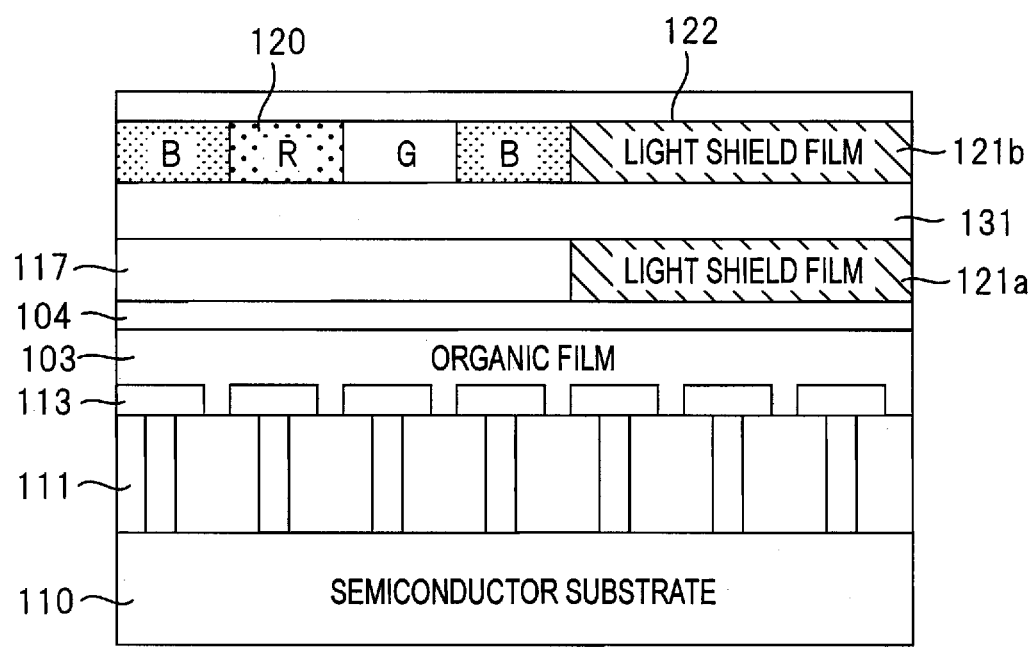
FIG. 6 is a schematic sectional view of a solid-state imaging device according to another exemplary embodiment of the invention.

The exemplary embodiment of FIG. 6 is different from that of FIG. 5 in that a light shield film 121b is formed in place of the insulating layer 132. This exemplary embodiment is superior in light shield performance because of the presence of the two light shield films 121a and 121b.

Figure 7:
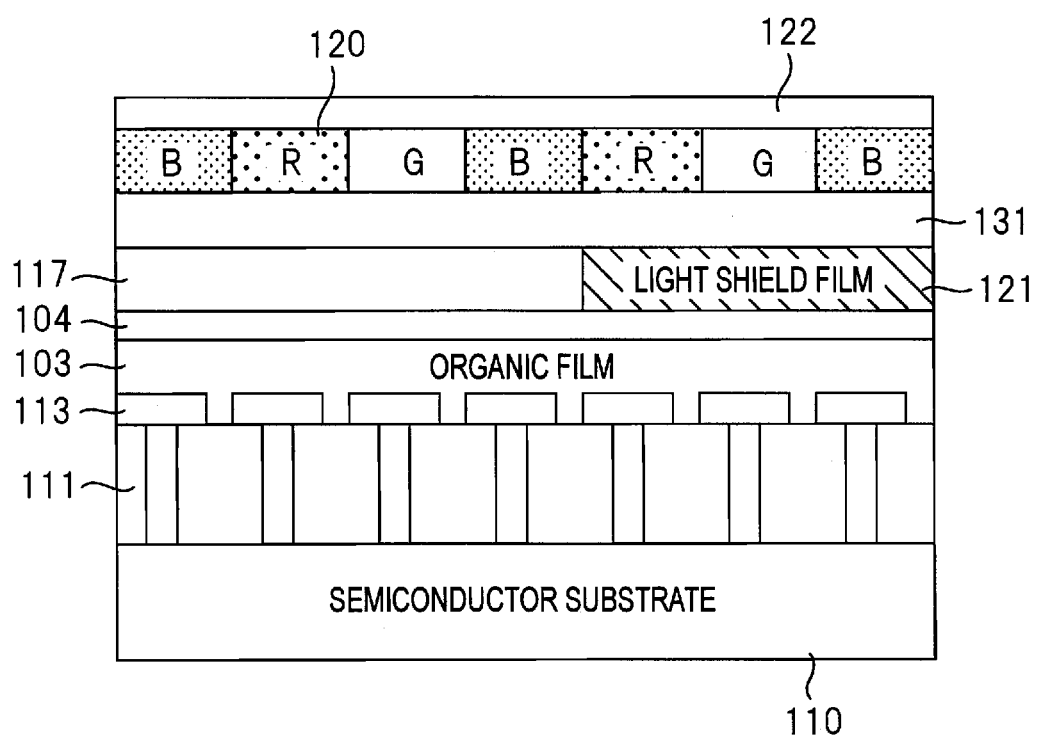
FIG. 7 is a schematic sectional view of a solid-state imaging device according to another exemplary embodiment of the invention.

The exemplary embodiment of FIG. 7 is different from that of FIG. 5 in that the color filter layer 120 extends so as to occupy the area of the insulating layer 132. The number of manufacturing steps can be decreased because the step of forming the insulating layer 132 is not necessary.

Figure 8:
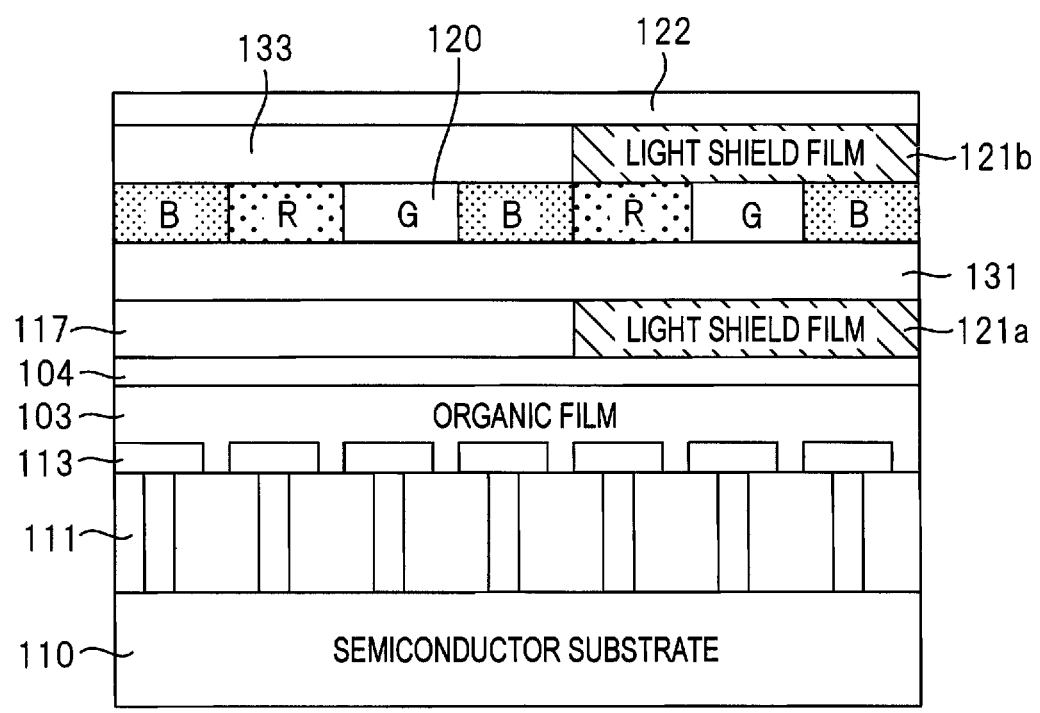
FIG. 8 is a schematic sectional view of a solid-state imaging device according to another exemplary embodiment of the invention.

The exemplary embodiment of FIG. 8 is different from that of FIG. 7 in that a second light shield film 121b is formed on the part, outside the effective pixel region 101, of the color filter layer 120. The light shield performance is enhanced because of the two light shield films 121a and 121b. A transparent insulating layer 133 is formed in the effective pixel region 101 in the same layer as the light shield film 121b, and the planarization layer 122 is formed as a topmost layer.

Figure 9:
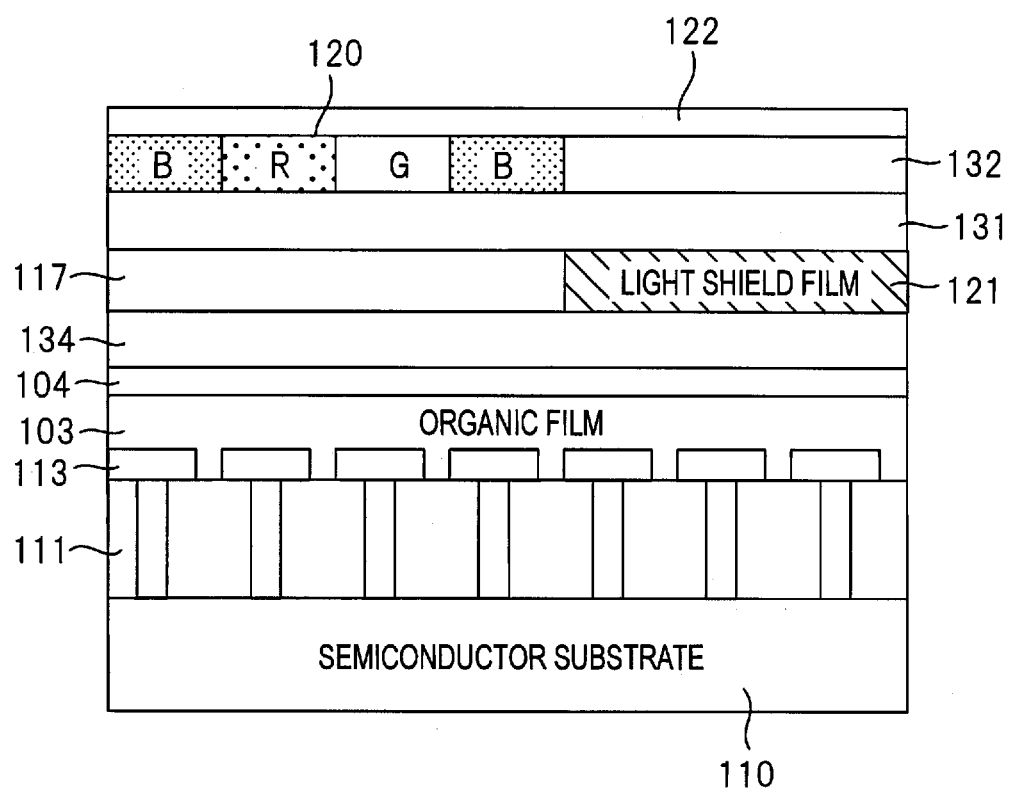
FIG. 9 is a schematic sectional view of a solid-state imaging device according to still another exemplary embodiment of the invention.

The exemplary embodiment of FIG. 9 is different from that of FIG. 5 in that a protective layer 134 is interposed between the upper electrode film 104 and the light shield film 121 and the smoothing layer 117.

Figure 10:
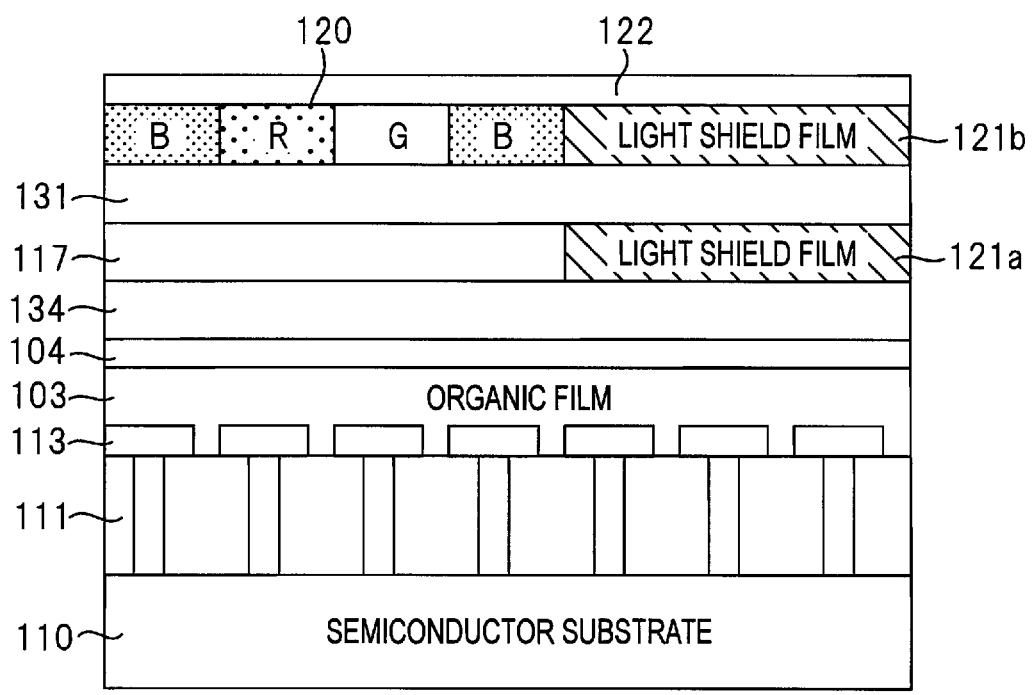
FIG. 10 is a schematic sectional view of a solid-state imaging device according to another exemplary embodiment of the invention.

The exemplary embodiment of FIG. 10 is different from that of FIG. 6 in that a protective layer 134 is interposed between the upper electrode film 104 and the light shield film 121 and the smoothing layer 117.

Figure 11:
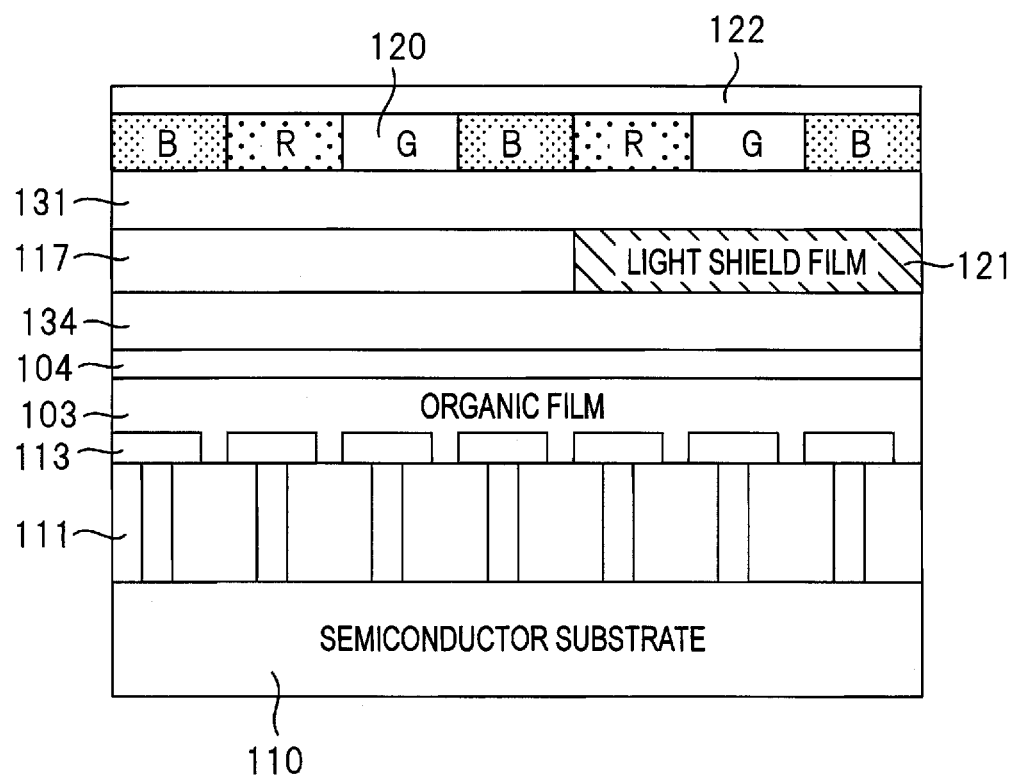
FIG. 11 is a schematic sectional view of a solid-state imaging device according to another exemplary embodiment of the invention.

The exemplary embodiment of FIG. 11 is different from that of FIG. 7 in that a protective layer 134 is interposed between the upper electrode film 104 and the light shield film 121 and the smoothing layer 117.

Figure 12:
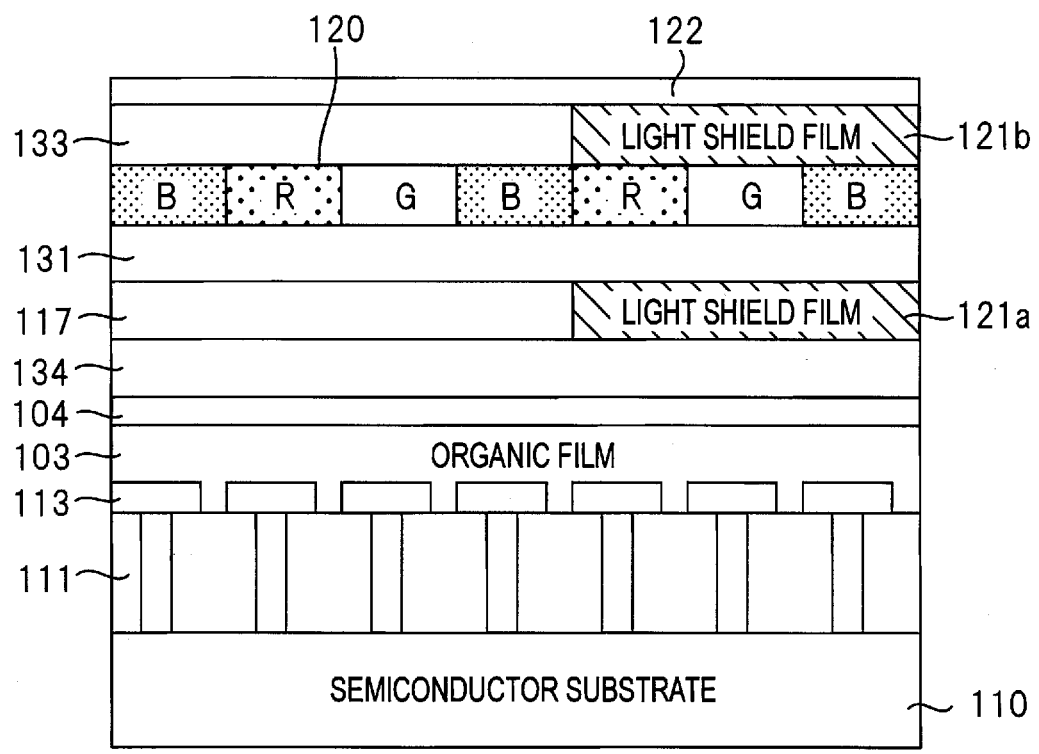
FIG. 12 is a schematic sectional view of a solid-state imaging device according to yet another exemplary embodiment of the invention.

The exemplary embodiment of FIG. 12 is different from that of FIG. 8 in that a protective layer 134 is interposed between the upper electrode film 104 and the light shield film 121 and the smoothing layer 117.

Figure 13:
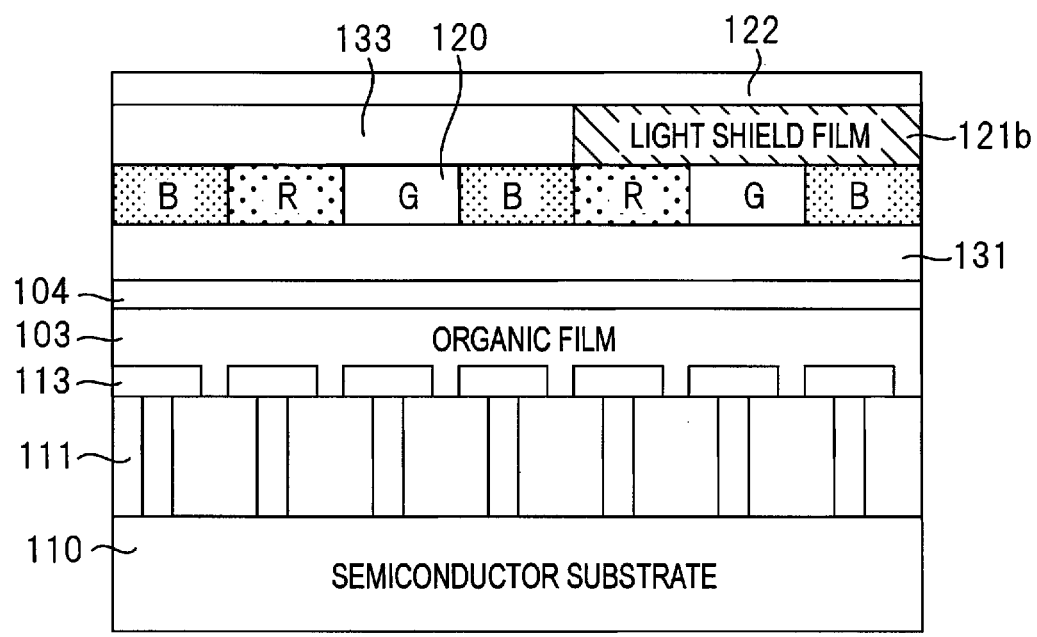
FIG. 13 is a schematic sectional view of a solid-state imaging device according to another exemplary embodiment of the invention.

The exemplary embodiment of FIG. 13 is different from that of FIG. 8 in that the light shield film 121a which is one of the two light shield films 121a and 121b and the smoothing layer 117 which is in the same layer as the light shield film 121a are removed.

Figure 14:
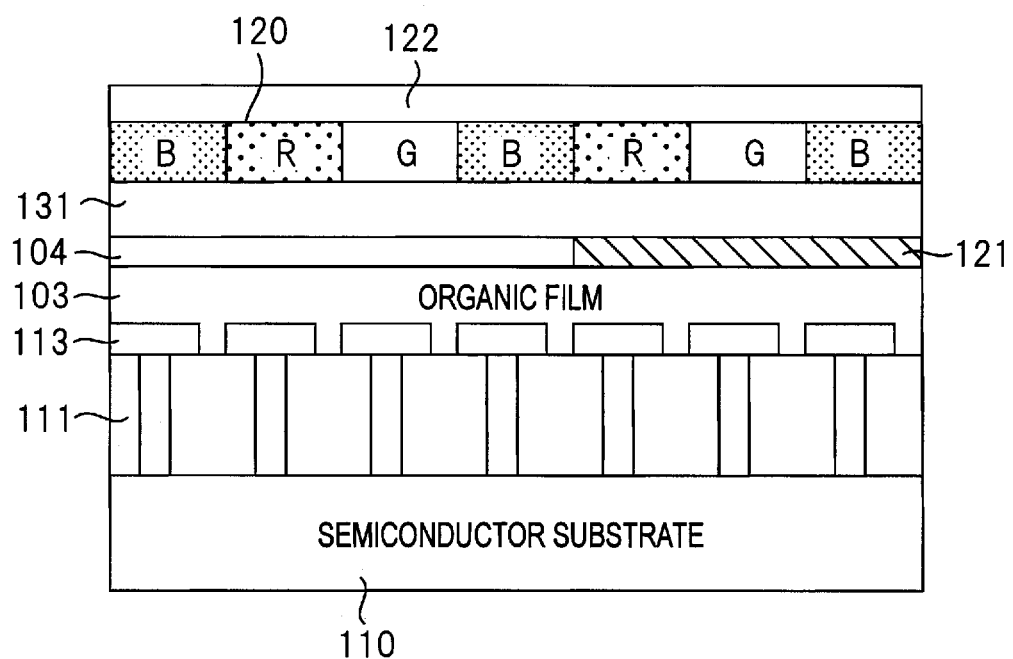
FIG. 14 is a schematic sectional view of a solid-state imaging device according to a further exemplary embodiment of the invention.

The exemplary embodiment of FIG. 14 is different from that of FIG. 7 in that the smoothing layer 117 and the light shield film 121 which is in the same layer as the smoothing layer 117 are removed and a light shield film 121 is formed in place of the part, outside the effective pixel region 101, of the upper electrode film 104. This exemplary embodiment makes it possible to provide a thinnest solid-state imaging device among the exemplary embodiments of FIGS. 4-13. A structure and materials that minimize the dark current are selected taking into consideration the adhesion, the connectivity, and the work function differences between the photoelectric conversion film 103, the upper electrode film 104, and the light shield film(s).

As described above, a photoelectric conversion film stack-type solid-state imaging device according to the exemplary embodiments includes a semiconductor substrate, a photoelectric conversion layer, a photoelectric conversion layer, and a conductive light shield film. A signal reading portion is formed on the semiconductor substrate. The photoelectric conversion layer is stacked above the semiconductor substrate and includes a photoelectric conversion film formed between a first electrode film and a second electrode films which is divided into a plurality of regions corresponding to pixels respectively. The first light transmission layer is stacked above the light incidence side of the photoelectric conversion layer and made of a material that transmits light at least partially. The conductive light shield film is formed in the same layer level as the first light transmission layer and covers an outside of an effective pixel region.

The photoelectric conversion film stack-type solid-state imaging device may be such that the first light transmission layer is a color filter layer.

The photoelectric conversion film stack-type solid-state imaging device may be such that the first light transmission layer is a first protective film which is laid over the photoelectric conversion layer.

The photoelectric conversion film stack-type solid-state imaging device may further comprise a color filter layer laid over the first protective layer, a transparent second protective layer laid on the color filter layer, and a second light shield film laid in the same layer as the second protective layer outside the effective pixel region.

The photoelectric conversion film stack-type solid-state imaging device may further comprise a color filter layer laid over the first protective layer and an insulating layer laid in the same layer as the color filter layer outside the effective pixel region.

The photoelectric conversion film stack-type solid-state imaging device may further comprise a second light transmission layer interposed between the photoelectric conversion layer and the color filter layer and a second light shield film laid in the same layer as the second light transmission layer outside the effective pixel region.

The photoelectric conversion film stack-type solid-state imaging device may further comprise a color filter layer which is laid above the first protective layer so as to extend to outside the effective pixel region.

The photoelectric conversion film stack-type solid-state imaging device may further comprise a transparent second protective layer laid on the color filter layer and a second light shield film laid in the same layer as the second protective layer outside the effective pixel region.

The photoelectric conversion film stack-type solid-state imaging device may further comprise a transparent protective layer which is laid between the first light transmission layer and the photoelectric conversion layer.

The photoelectric conversion film stack-type solid-state imaging device may further comprise a transparent protective layer which is laid between the second light transmission layer and the photoelectric conversion layer.

The photoelectric conversion film stack-type solid-state imaging device may be such that it further comprises a color filter layer which is laid over the photoelectric conversion layer, and that the first light transmission layer is laid on the color filter layer.

The photoelectric conversion film stack-type solid-state imaging device may be such that the photoelectric conversion layer is formed in such a manner that the first electrode film is located on the light incidence side and also serves as the first light transmission layer.

An imaging apparatus according to the exemplary embodiments comprises any of the above photoelectric conversion film stack-type solid-state imaging devices.

According to the exemplary embodiments, since each light shield film which is provided outside the effective pixel region is formed in the same layer as the upper electrode film or another constituent layer, the surface of the solid-state imaging device can be made flat and hence image quality degradations due to diffuse reflection of light. Since a dark-time signal which is used as a reference signal can be detected accurately from the OB regions, high-quality subject image signals can be obtained.

According to the embodiment, since the light shield films which are provided in the OB regions are formed in the same layer as another constituent layer that is provided in the effective pixel region, diffuse reflection can be avoided and the entire surface of the solid-state imaging device can be made flat and hence high-quality shot images can be obtained. Since a highly accurate dark-time reference signal can be obtained from the OB regions, high-quality image signals having large S/N ratios can be obtained.

DESCRIPTION OF SYMBOLS

21: Shooting lens
26: Digital signal processing section
29: System control section
100: Photoelectric conversion film stack-type solid-state imaging device
101: Effective pixel region
102: OB (optical black) region
103: Photoelectric conversion film (organic film)
104: Upper electrode film (common electrode film, counter electrode film, first electrode film)
110: Semiconductor substrate
111, 133, 134: Insulating layer
112: Wiring layer
113: Lower electrode film (pixel electrode film, second electrode film)
114: Vertical interconnection (plug)
117: Protective layer
118: Smoothing layer
120: Color filter layer
121, 121a, 121b: Light shield film
122: Planarization layer

What is claimed is:

1. A photoelectric conversion film stack-type solid-state imaging device comprising:
    a semiconductor substrate on which a signal reading portion is formed;
    a photoelectric conversion layer that is stacked above the semiconductor substrate and includes a photoelectric conversion film formed between a first electrode film and a second electrode films which is divided into a plurality of regions corresponding to pixels respectively;
    a first light transmission layer that is stacked above the light incidence side of the photoelectric conversion layer and made of a material that transmits light at least partially,
    a light shield film that is disposed in the same layer level as the first light transmission layer and covers an outside of an effective pixel region, and
    a transparent protective layer disposed between the first light transmission layer and the photoelectric conversion layer,
    wherein the first light transmission layer is a color filter layer.

2. The photoelectric conversion film stack-type solid-state imaging device according to claim 1 further comprising:
    a second light transmission layer that is disposed between the photoelectric conversion layer and the color filter layer; and
    a second light shield film that is disposed in the same layer as the second light transmission layer outside the effective pixel region.

3. The photoelectric conversion film stack-type solid-state imaging device according to claim 2 further comprising a transparent protective layer that is disposed between the second light transmission layer and the photoelectric conversion layer.

4. An imaging apparatus comprising a photoelectric conversion film stack-type solid-state imaging device including:

a semiconductor substrate on which a signal reading portion is formed;

a photoelectric conversion layer that is stacked above the semiconductor substrate and includes a photoelectric conversion film formed between a first electrode film and a second electrode films which is divided into a plurality of regions corresponding to pixels respectively;

a first light transmission layer that is stacked above the light incidence side of the photoelectric conversion layer and made of a material that transmits light at least partially, a light shield film that is disposed in the same layer level as the first light transmission layer and covers an outside of an effective pixel region, and a transparent protective layer that is disposed between the first light transmission layer and the photoelectric conversion layer, wherein the first light transmission layer is a color filter layer.

5. The imaging apparatus according to claim 4 further comprising:

a second light transmission layer that is disposed between the photoelectric conversion layer and the color filter layer; and a second light shield film that is disposed in the same layer as the second light transmission layer outside the effective pixel region.

* * * * *